United States Patent [19]
Allen et al.

[11] Patent Number: 5,512,606
[45] Date of Patent: Apr. 30, 1996

[54] PHOTO-CROSSLINKABLE POLYAMIDE MATERIALS

[76] Inventors: Norman S. Allen, Halliwell; John P. Hurley, Didsbury, both of Great Britain

[21] Appl. No.: 232,138
[22] PCT Filed: Oct. 15, 1992
[86] PCT No.: PCT/GB92/01889
  § 371 Date: Aug. 16, 1994
  § 102(e) Date: Aug. 16, 1994
[87] PCT Pub. No.: WO93/09471
  PCT Pub. Date: May 13, 1993

[30] Foreign Application Priority Data

Oct. 30, 1991 [GB] United Kingdom ............ 9122989

[51] Int. Cl.$^6$ .............. C08F 2/50; C08L 77/02; C08L 77/06
[52] U.S. Cl. .......... 522/048; 522/135; 522/136; 522/144; 522/164; 522/134
[58] Field of Search ................ 522/48, 8, 135, 522/136, 134, 146, 147, 149, 164, 144, 137

[56] References Cited

U.S. PATENT DOCUMENTS

| | | | |
|---|---|---|---|
| 3,591,661 | 7/1971 | Rogers | 260/897 |
| 4,198,241 | 4/1980 | Bronstert et al. | 430/284 |
| 4,767,642 | 8/1988 | Shimizu et al. | 430/300 |
| 4,988,664 | 1/1991 | Smith et al. | 428/195 |
| 5,283,160 | 2/1994 | Allen et al. | 522/48 |

FOREIGN PATENT DOCUMENTS 3704067  3/1987  Netherlands.

*Primary Examiner*—Susan W. Berman

[57] ABSTRACT

Photo-crosslinkable materials comprising a linear polyamide and a 2-substituted anthraquinone as photo-crosslinking agent, the 2-substituted anthraquinone preferably being 2-acrylamidooanthraquinone, 2-acryloxyanthraquinone or 2-benzoylaminoanthraquinone.

3 Claims, No Drawings

PHOTO-CROSSLINKABLE POLYAMIDE MATERIALS

This invention relates to materials based on linear polyamides and to articles such as fibres and films produced from such materials, and in particular to materials and articles which are photo-crosslinkable.

The normal effect of radiation on polyamides is to cause degradation by breaking of the polymer chain. Although the use of a polymide in photo-crosslinkable materials is known, the polymide itself takes little or no part in the crosslinking, being only present as a support. In such materials the photo-crosslinking is produced by a photopolymerisable monomer containing, for example unsaturated groups as described in U.S. Pat. No. 4,144,073. An improvement can be effected by additionally providing unsaturated groups grafted onto the polymide backbone as described in U.S. Pat. No. 4,421,840.

Surprisingly, it has now been found that photo-crosslinking of polyamides can be effected by using a suitable photo-crosslinking agent without the necessity of the unsaturated photo-polymerisable groups being present.

According to one aspect of the present invention there is provided a photo-crosslinkable material comprising a linear polymide and a 2-substituted anthraquinone as photo-crosslinking agent.

According to a preferred aspect of the invention, the 2-substituted anthraquinone has the formula

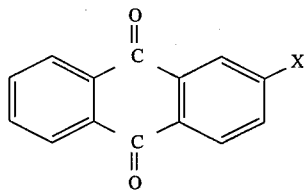

where X is selected from a group consisting of NHC(O)CH=CH$_2$, OC(O)CH=CH$_2$, OC(O)C(CH$_3$)=CH$_2$ and NHC(O)C$_6$H$_5$.

The other positions on the anthraquinone ring may be optionally substituted.

Preferably the 2-substituted anthraquinone is 2-acrylamidoanthraquinone (X=NHC(O)CH=CH$_2$), or 2-acryloxyanthraquinone (X=OC(O)CH=CH$_2$), or 2-benzoylaminoanthraquinone (X=NHC(O)C$_6$H$_5$).

The photo-crosslinkable material may contain two or more of the 2-substituted anthraquinones or a mixture of one or more of the 2-substituted anthraquinones with one or more other photoinitiator materials.

Any polyamide may be used but poly(hexamethylene adipamide) (more commonly known as nylon 6.6) or polycaprolactam (more commonly known as nylon 6) is preferred.

According to a further aspect of the invention there is provided a solvent—cast film or a melt spun fibre comprising a polyamide having incorporated therein, or coated on the surface thereof, a 2-substituted anthraquinone.

The 2-substituted anthraquinone may be incorporated into the polymer before or during the melt spinning or may be applied to the surface of the fibre as a spin finish or during the dyeing process.

Photo-crosslinking may be effected using radiation from sources having emission maxima in the range 200 to 500 mm and especially in the range 400 to 500 mm. Such sources may be actinic or super actinic fluorescent tubes, mercury vapour lamps and xenon lamps.

Whilst the 2-substituted anthraquinones are known generally, compounds containing a (meth)acryloxy group in the 2-position are novel.

Hence, according to a further aspect of the invention, there is provided a photoiniator compound having the formula

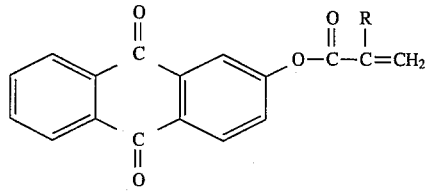

where R is hydrogen or a methyl group.

The invention will be illustrated by the following examples.

EXAMPLE 1

Nylon 6.6 chips (2% by weight) were dissolved in trifluoroethanol and 0.2% by weight 2-acrylamidoanthraquinone (AAAQ) added. A series of film samples was produced by spreading the resultant solution on glass plates and evaporating the solvent. Control samples not containing the AAAQ were also prepared.

The films were removed from the plates and irradiated for various times using a 400 watt mercury lamp.

The amount of gel formation, which is proportional to the degree of cross-linking, was determined by dissolving a sample in a fixed volume of formic acid, pouring the solution into a glass funnel containing a glass wool plug (the funnel and plug having been dried to constant weight) to filter out the undissolved gel, washing with a fixed volume of formic acid and again drying to constant weight. The results are shown in Table 1.

EXAMPLE 2

Example 1 was repeated except that 2-acryloxyanthraquinone (AOAQ) and 2-benzoylaminoanthraquinone (BOAAQ) were used. The results are also shown in Table 1.

TABLE 1

| Time | % Gel | | | |
| --- | --- | --- | --- | --- |
| (Minutes) | Control | AAAQ | AOAQ | BOAAQ |
| 0 | 0 | 0 | 0 | 1.8 |
| 5 | 2.93 | 7.2 | 5.5 | |
| 10 | 3.8 | 27.4 | 17.24 | |
| 20 | | 45.0 | 41.14 | |
| 30 | 12.44 | 59.4 | 53.53 | 42.2 |

EXAMPLE 3

Samples of nylon 6.6, semi-dull, carpet yarn consisting of 68 filaments each having an approximate decitex of 19 were boiled for 30 minutes in an 80/20 water/isopropyl alcohol solution containing 1% by weight AAAQ and 5% by weight benzyl alcohol, the benzyl alcohol being present as a swelling agent for the nylon. Control samples were prepared in the same way but without AAAQ present in the solution.

The dried samples were unravelled and laid on a flat surface beneath a 400 watt mercury lamp for various periods, each sample being turned over half way through the period. The amount of gel formation was determined in the same way as in Example 1. The results are shown in Table 2.

EXAMPLE 4

Example 3 was repeated using samples of nylon 6.6 film. The results are also shown in Table 2.

TABLE 2

| Time | % Gel | | | |
|---|---|---|---|---|
| | Fibre | | Film | |
| (Minutes) | Control | AAAQ | Control | AAAQ |
| 0 | 1.0 | 0 | 0 | 0 |
| 20 | 2.4 | 20.4 | 2.4 | 15.2 |
| 40 | 10.4 | 33.2 | 7.0 | 41.3 |
| 60 | 14.8 | 30.0 | 8.0 | 45.7 |
| 80 | 20.1 | 39.0 | | |

EXAMPLE 5

SYNTHESIS OF 2-ACRYLOXYANTHRAQUINONE 2-hydroxyanthraquinone (2 g), water (125 ml), dioxane (25 ml) and KOH (20 g) were mixed together in an appropriate vessel in an ice bath. A deep red colour was produced due to formation of a phenoxide salt of the anthraquinone. Acryloyl chloride was added dropwise until no further colour could be seen, whilst maintaining the temperature below 0.5° C. The residue was then filtered and washed with water followed by recrystallisation from aqueous ethanol. The yield was approximately 60%.

We claim:

1. A photo-crosslinkable material comprising a linear polyamide selected from the group consisting of polyhexamethylene adipamide and polycaprolactam and a 2-substituted anthraquinone as a photo-crosslinking agent, said 2-substituted anthraquinone having the formula:

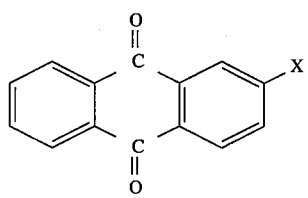

where X is selected from a group consisting of NHC(O)CH=CH$_2$, OC(O)CH=CH$_2$, OC(O)C(CH$_3$)=CH$_2$ and NHC(O)C$_6$H$_5$.

2. A solvent-cast film comprising a polyamide having incorporated therein or coated on the surface thereof a 2-substituted anthraquinone having the formula

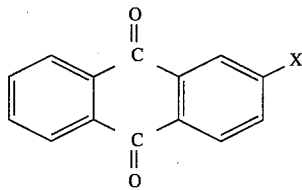

where X is selected from a group consisting of NHC(O)CH=CH$_2$, OC(O)CH=CH$_2$, OC(O)C(CH$_3$)=CH$_2$ and NHC(O)C$_6$H$_5$.

3. A melt-spun fibre comprising a polyamide having incorporated therein or coated on the surface thereof, a 2-substituted anthraquinone having the formula

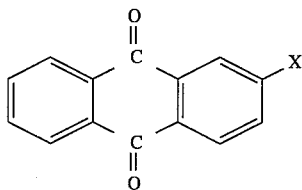

where X is selected from a group consisting of NHC(O)CH=CH$_2$, OC(O)CH=CH$_2$, OC(O)C(CH$_3$)=CH$_2$ and NHC(O)C$_6$H$_5$.

* * * * *